United States Patent [19]

Karpol et al.

[11] Patent Number: 5,140,608
[45] Date of Patent: Aug. 18, 1992

[54] OPTICAL SYSTEM FOR FOCUSING A LIGHT BEAM ON TO AN IMAGE PLANE

[75] Inventors: Avner Karpol, Tel-Aviv; Eviatar Halevi, Maccabim; Abraham Gross, Rehovot, all of Israel

[73] Assignee: Optrotech Ltd, Israel Company, Nes Ziona, Israel

[21] Appl. No.: 706,658

[22] Filed: May 29, 1991

[51] Int. Cl.$^5$ ............................................. H01S 3/08
[52] U.S. Cl. .................................... 372/101; 359/708
[58] Field of Search ............... 350/432, 433, 434, 435; 372/101

[56] References Cited

U.S. PATENT DOCUMENTS

| | | | |
|---|---|---|---|
| 4,203,652 | 5/1980 | Hanada | 350/182 |
| 4,577,932 | 3/1986 | Gelbart | 350/358 |
| 4,810,069 | 3/1989 | Kobayashi | 350/413 |
| 4,968,874 | 11/1990 | Kasuga | 350/171 |

Primary Examiner—John D. Lee
Assistant Examiner—Robert E. Wise
Attorney, Agent, or Firm—Helfgott & Karas

[57] ABSTRACT

An optical system for focusing a light beam on to an image plane particularly suited for compensating for manufacturing tolerances associated with laser diodes having variable divergence and astigmatism characteristics. The system comprises a collimation lens for collimating the light beam so as to produce a collimated beam in a first plane and an optical shaper having an axis perpendicular to the first plane for correcting distortions associated with the collimated beam and spatially displaced from the collimation lens so as to form the collimated beam on to the image plane. Preferably, the optical shaper includes a pair of cylindrical lenses separated from each other a predetermined distance so as to minimize astigmatism and divergence of the beam. In use, the optical system is adjusted by displacing the collimating lens from the light source so as to produce a collimated beam of light, adjusting the distance between the cylindrical lenses so as to derive a shaped beam having minimal astigmatism and divergence, and adjusting the distance between the collimating lens and the optical shaper so as to focus the shaped beam on to the image plane.

7 Claims, 2 Drawing Sheets

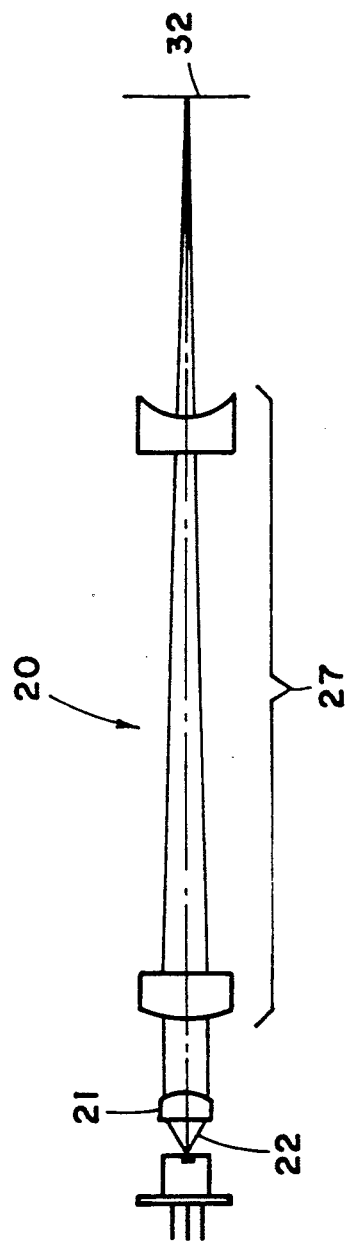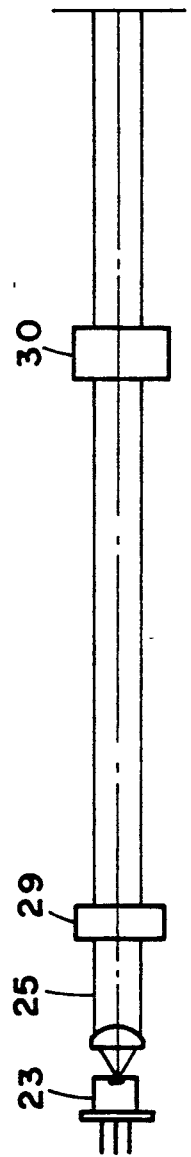

OPTICAL SYSTEM FOR FOCUSING A LIGHT BEAM ON TO AN IMAGE PLANE

FIELD OF THE INVENTION

This invention relates to an optical system for focusing a light beam on to an image plane.

BACKGROUND OF THE INVENTION

It is known to employ laser light sources in multi-spot laser plotters in order to illuminate a line in an optical image plane, thereby exposing simultaneously more than one spot and increasing the plot speed without exceeding the mechanical speed limitation. Thus, for example, U.S. Pat. No. 4,577,932 (Gelbart) describes a multi-spot light modulator using a laser diode in which a single light pulse from the laser diode generates a multi-spot image of a data pattern. Such a system is inherently faster than single-spot modulators since it records a plurality of bits at the same time.

In such systems, the width of the illuminated line determines the resolution of the laser plotter and the optics must therefore be designed so as to conform to the required resolution.

Furthermore, in order to produce a uniform image, the illuminated line must likewise be uniform. The requirements of tightly specified width and uniformity along the illuminated line are especially important when employing laser plotters to plot features of a very accurate dimension and position on a film.

In practical systems, it is difficult to realise these requirements for a variety of reasons. Effects such as concentric rings, aperture diffraction and optical imperfection all militate against the requirement to produce a uniform light distribution along the illuminated line. Optical imperfection is particularly severe in laser diodes having a large Numerical Aperture of the order of 0.4.

The laser source itself must be finely controlled in order to produce an illuminating line of constant width and uniformity with a specified optical system. In practice, ostensibly identical laser diodes having the same manufacturer and model number have a divergence spread which varies from diode to diode. This causes size variation of the width and length of the illuminating line and, in order to produce a line of constant, minimal width, the optical system would require customizing, by providing a custom designed collimating lens, for each laser diode in a batch. This, of course, is clearly impractical.

In order to optimize the optical performance at the illuminated area whilst, at the same time, maximizing the depth of focus in accordance with the basic laws of diffraction, the illuminating beam should be collimated and its waist should correspond to that for a source having a Gaussian shaped energy distribution along its width at any cross-section along its length. For such a source, the waist band is the area of minimum divergence.

The astigmatism in the laser diode source causes the beam to diverge from an apparently different position perpendicularly to the beam directions. The astigmatism itself and its variation from one diode to another affects the position and shape of the resulting line image.

SUMMARY OF THE INVENTION

It is an object of the invention to provide an optical system for focusing a light beam on to an image plane, in which the drawbacks described above are substantially reduced or eliminated.

According to the invention there is provided an optical system for focusing a light beam on to an image plane, the system comprising:

a collimation lens for collimating the light beam so as to produce a collimated beam in a first plane, an optical shaper having an axis perpendicular to said first plane for correcting distortions associated with the collimated beam and spatially displaced from the collimation lens so as to form the collimated beam on to the image plane.

Preferably, the light beam is derived from a laser source such as a laser diode and the optical shaper includes a pair of cylindrical lenses separated from each other a predetermined distance so as to minimize astigmatism and divergence of the laser beam.

Such an optical system may easily be configured for use with a particular laser diode by displacing the collimating lens from the laser diode so as to produce a collimated beam of light, adjusting the distance between the cylindrical lenses so as to derive a shaped beam having minimal astigmatism and divergence, and then adjusting the distance between the collimating lens and the optical shaper so as to focus the shaped beam on to the required image plane.

BRIEF DESCRIPTION OF THE DRAWINGS

For a clearer understanding of the invention and to see how the same may be carried out in practice, a preferred embodiment will now be described, by way of nonlimiting example only, with reference to the accompanying drawings, in which:

FIG. 2 is a schematic representation showing mutually perpendicular views of an optical system according to the invention.

DETAILED DESCRIPTION OF A PREFERRED EMBODIMENT

Figure 1:
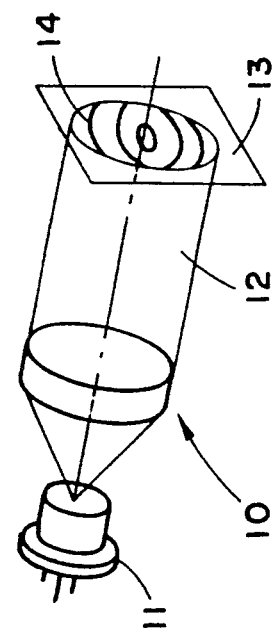
FIG. 1 is a pictorial representation showing a prior art optical system and an associated energy distribution curve.

Referring to FIG. 1 there is shown an optical system depicted generally as 10 for focusing a laser diode 11 as a focused beam 12 on to an image plane 13.

A beam profile 14 on the image plane 13 shows a power distribution of the focused beam 12, cross-section 15 thereof showing that the power distribution is non-uniform. The problem of non-uniform power distribution associated with the optical system 10 manifests itself when the image plane 13 is within the near field of the optical system 10. Calculation of the near field may be derived as follows:

$$L \leq \frac{D^2}{\lambda}$$

where

L is the image distance from the optical system 10 to the image plane 13,

D is the diameter of the aperture of the optical system 10, and

λ is the wavelength of the laser beam 12.

Thus, if D=5 mm and λ=0.8 μm, then:

$$L \leq \frac{25 \times 10^{-6}}{0.8 \times 10^{-6}} = \frac{250}{8} \approx 30 \text{ m}$$

It follows that if the aperture diameter of the optical system 10 is 5 mm and the wavelength of the laser beam 12 is 0.8 μm, the corresponding value of L is 30 m. Thus, if the distance between the optical system 10 and the image plane 13 is less than 30 m, the power distribution 14 associated with the focused beam 12 will be non-uniform as explained above. This problem thus arises in practical systems where the image distance L is very much less than 30 m.

FIG. 2 shows two mutually perpendicular cross-sectional views of an optical system depicted generally as 20 in accordance with the invention. The optical system 20 comprises a collimation lens 21 for collimating a light beam 22 derived from a laser diode source 23 as a collimated beam 25. An optical shaper 27 comprising a pair of cylindrical lenses 29 and 30 separated from each other a predetermined distance, is spatially displaced from the collimating lens 21 so as to focus the collimated beam 25 on to an image plane 32 whilst correcting distortions associated with the collimated beam 25.

In the preferred embodiment depicted in FIG. 2, the cylindrical lens 29 is shown as having a positive focal length whilst the cylindrical lens 30 is shown as having a negative focal length. However, in general, the cylindrical lenses 29 and 30 may be of either positive or negative focal lengths consistent only with the complete length of the optical system 20.

Figure 3:
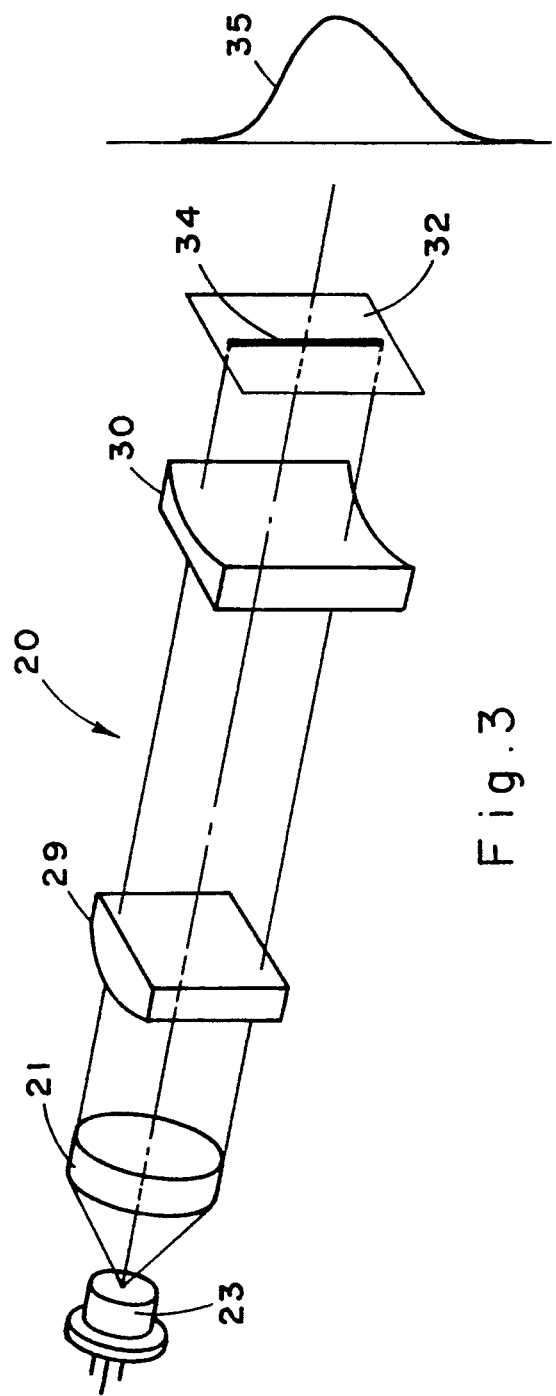
FIG. 3 is a pictorial representation showing in perspective the optical system illustrated in FIG. 2 together with an associated energy distribution curve.

Referring to FIG. 3 there is shown, in perspective, the configuration depicted schematically in FIG. 2 there being further shown on the image plane 32 a beam profile 34, a cross-section 35 thereof showing the power distribution of the focused beam. It will be noted that, providing the optical system 20 is correctly adjusted, the power distribution 35 is uniform.

Correct adjustment of the optical system 20 is as follows. The collimating lens 21 is displaced from the laser diode 23 so as to produce a correctly collimated beam 25 (FIG. 2). The distance between the two cylindrical lenses 29 and 30 is then adjusted so as to derive a shaped beam having minimal astigmatism and divergence (i.e. corresponding to the beam profile 34 and 35). Finally, whilst maintaining the two cylindrical lenses 29 and 30 in correct mutual displacement, the distance between the collimating lens 21 and the optical shaper 27 is adjusted so as to focus the shaped beam on to the image plane 32.

The above steps for adjusting the optical system 20 are easily and quickly performed in conjunction with each laser diode 23 with which the optical system 20 is to be used and permit a single optical system 20 to compensate exactly for slight irregularities in the characteristics of the laser diode 23. This permits the three optical components 21, 29 and 30 associated with the optical system 20 to be mass-manufactured, the resulting customization for each individual laser diode 23 being performed during assembly in a simple and effective manner.

We claim:

1. An optical system for focusing a light beam as a line on to an image plane, the system comprising:
    a collimation lens for collimating the light beam so as to produce a collimated beam in a first plane,
    an optical shaper having an axis perpendicular to said first plane for correcting distortions associated with the collimated beam and being spatially displaced from the collimation lens so as to shape the collimated beam as a uniform line having a waist coplanar with the image plane.

2. The optical system according to claim 1, wherein the light beam is derived from a laser source.

3. The optical system according to claim 2, wherein the laser source is a laser diode.

4. The optical system according to claim 3, wherein the optical shaper includes a pair of cylindrical lenses separated from each other by an amount which is adjustable so as to minimize astigmatism and divergence of said beam.

5. The optical system according to claim 2, wherein the optical shaper includes a pair of cylindrical lenses separated from each other by an amount which is adjustable so as to minimize astigmatism and divergence of said beam.

6. The optical system according to claim 1, wherein the optical shaper includes a pair of cylindrical lenses separated from each other by an amount which is adjustable so as to minimize astigmatism and divergence of said beam.

7. A method for using the system according to claim 6, comprising the steps of:
    displacing the collimating lens from the light source so as to produce a collimated beam of light,
    adjusting the distance between the cylindrical lenses so as to derive a shaped beam having minimal astigmatism and divergence, and
    adjusting the distance between the collimating lens and the optical shaper so as to focus the shaped beam as a uniform line on to said image plane.

* * * * *